(12) United States Patent
Iwamoto et al.

(10) Patent No.: US 7,876,118 B2
(45) Date of Patent: Jan. 25, 2011

(54) TEST EQUIPMENT

(75) Inventors: Satoshi Iwamoto, Saitama (JP); Shigeki Takizawa, Saitama (JP); Koichi Yatsuka, Gunma (JP); Toshio Matsuura, Saitama (JP)

(73) Assignee: Advantest Corporation, Tokyo (JP)

( * ) Notice: Subject to any disclaimer, the term of this patent is extended or adjusted under 35 U.S.C. 154(b) by 157 days.

(21) Appl. No.: 12/365,900

(22) Filed: Feb. 5, 2009

(65) Prior Publication Data

US 2010/0194421 A1 Aug. 5, 2010

(51) Int. Cl.
G01R 31/26 (2006.01)

(52) U.S. Cl. ............... 324/762.01; 324/756.01

(58) Field of Classification Search ........................ None
See application file for complete search history.

(56) References Cited

U.S. PATENT DOCUMENTS 5,072,417 A * 12/1991 Aton et al. ................. 702/117
6,574,168 B2 * 6/2003 Hayashi ..................... 368/118
6,990,613 B2 * 1/2006 Doi et al. .................... 714/700

FOREIGN PATENT DOCUMENTS

| JP | 3066072 | 2/2000 |
|---|---|---|
| JP | 2005-91037 | 4/2005 |
| JP | 2006-300894 | 11/2006 |
| JP | 2007-315828 | 12/2007 |
| JP | 2009-025138 | 2/2009 |
| WO | 2006109463 | 10/2006 |
| WO | 2007077839 | 7/2007 |
| WO | 2008117468 | 10/2008 |

OTHER PUBLICATIONS

"Search Report of PCT Counterpart Application" issued on May 11, 2010, p. 1-p. 8.

* cited by examiner

*Primary Examiner*—Vinh P Nguyen
(74) *Attorney, Agent, or Firm*—Jianq Chyun IP Office (57) ABSTRACT

Provided is a test apparatus that tests a device under test, comprising a pattern generating section that generates a test pattern for testing the device under test; a signal supplying section that supplies the device under test with a test signal corresponding to the test pattern; a trigger generating section that supplies a trigger signal to an external instrument connected to the device under test; and a synchronization control section that outputs, to the trigger generating section, a synchronization signal instructing generation of the trigger signal, based on at least a portion of the test pattern generated by the pattern generating section.

6 Claims, 9 Drawing Sheets

| # | SEQUENCE DATA | COMMAND DATA | PATTERN DATA |
|---|---|---|---|
| 0 | NOP | 00000000 | HHLLHH··· |
| 1 | NOP | 10000101 | HLHLHL··· |
| 2 | LOOP ST | 00000000 | HHHLLL··· |
| ⋮ | ⋮ | ⋮ | ⋮ |
| 10 | LOOP END | 10000111 | HHHHHH··· |
| 11 | EXIT | 00000000 | LLLLLL··· |

TEST EQUIPMENT

BACKGROUND

1. Technical Field

The present invention relates to a test apparatus and a test method.

2. Related Art

A test apparatus for testing a semiconductor device inputs a prescribed test pattern into the semiconductor device and judges the acceptability of the semiconductor device by acquiring a signal sent by the semiconductor device in response to the input test pattern. If it is necessary to measure the waveform or the like of the signal output by the semiconductor device during testing, an external instrument such as an oscilloscope is connected to the test apparatus to acquire the signal.

The test apparatus includes a test module that tests the semiconductor device and a trigger generating module that connects the external instrument to the semiconductor device, and can therefore cause the external instrument to operate while simultaneously outputting the test pattern to the semiconductor device. In order to measure the waveform in synchronization with the test timing of the semiconductor device, it is necessary to synchronize the timing at which the external instrument acquires the signal with the test timing of the semiconductor device. Therefore, the test module and the trigger generating module include the same synchronization circuit to operate according to a common reference signal. Such a method for achieving synchronization between modules is disclosed in, for example, Japanese Patent Application Publication No. 2005-91037.

If the setting of only one of the modules is changed such that each module has a different synchronization circuit, however, synchronization cannot be achieved between the modules. As a result, when changing a setting of one of the synchronization circuits, it is necessary to apply the same setting change to the synchronization circuits of both the test module and the trigger generating module.

SUMMARY

Therefore, it is an object of an aspect of the innovations herein to provide a test apparatus, which is capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary test apparatus may include a test apparatus that tests a device under test, comprising a pattern generating section that generates a test pattern for testing the device under test; a signal supplying section that supplies the device under test with a test signal corresponding to the test pattern; a trigger generating section that supplies a trigger signal to an external instrument connected to the device under test; and a synchronization control section that outputs, to the trigger generating section, a synchronization signal instructing generation of the trigger signal, based on at least a portion of the test pattern generated by the pattern generating section.

According to a second aspect related to the innovations herein, one exemplary test method may include a method for testing a device under test, comprising generating a test pattern for testing the device under test; supplying the device under test with a test signal corresponding to the test pattern; outputting a synchronization signal instructing generation of a trigger signal, based on at least a portion of the generated test pattern; and supplying the trigger signal to an external instrument connected to the device under test, based on the synchronization signal instructing generation of the trigger signal.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
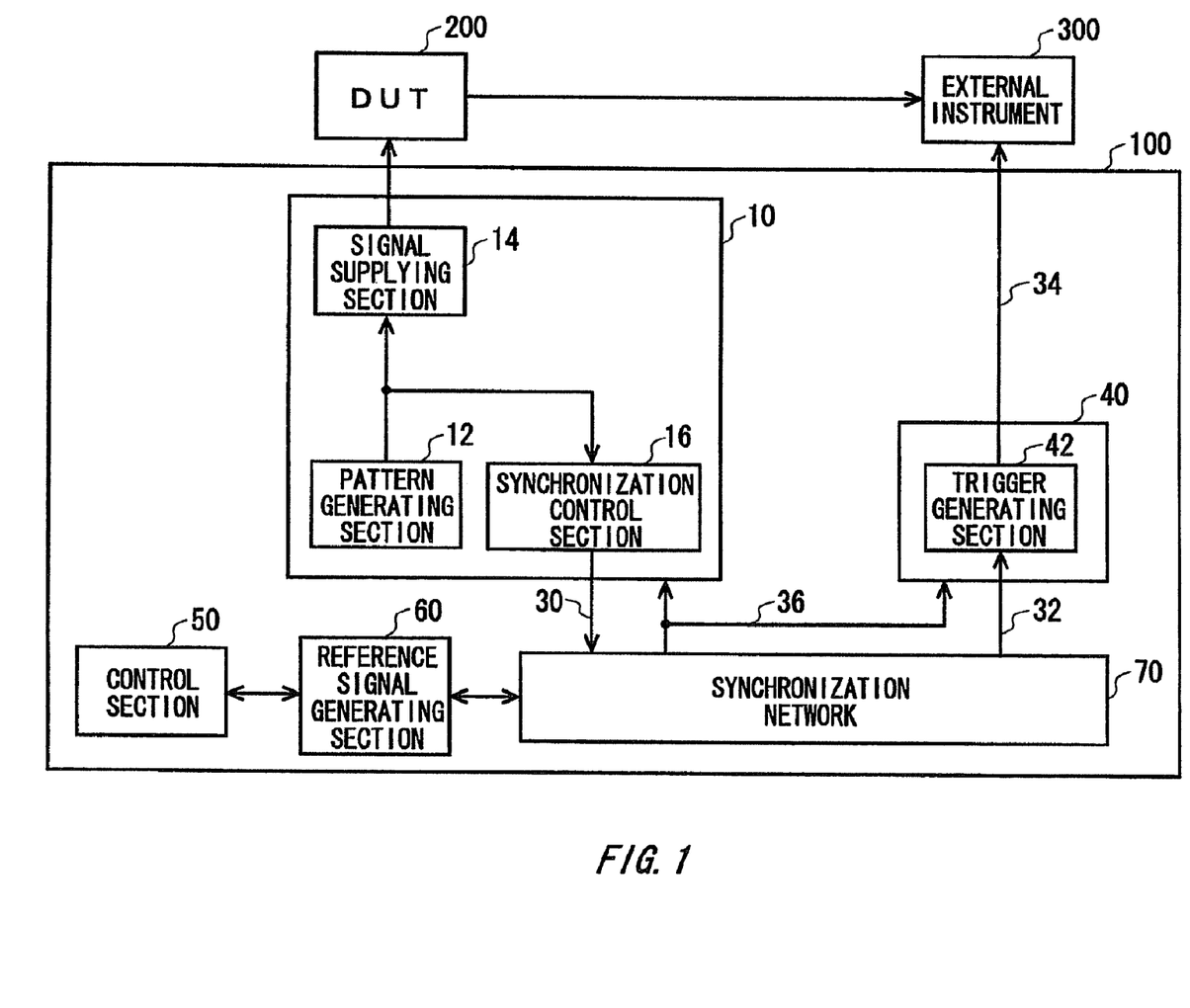
FIG. 1 shows an exemplary configuration of a test apparatus according to a first embodiment.

FIG. 1 shows an exemplary configuration of a test apparatus 100. The test apparatus 100 is connected to a device under test 200 and an external instrument 300. The test apparatus 100 includes a test module 10, a trigger generating module 40, a control section 50, a reference signal generating section 60, and a synchronization network 70. The synchronization network 70 provides a connection between the test module 10 and the trigger generating module 40.

The test module 10 includes a pattern generating section 12, a signal supplying section 14, and a synchronization control section 16. The pattern generating section 12 generates the test pattern for testing the device under test 200, and inputs the test pattern to the signal supplying section 14. The signal supplying section 14 supplies the device under test 200 with a test signal that corresponds to the test pattern via an I/O pin. The test module 10 may be connected to the device under test 200 via a performance board, a device socket, or the like.

The trigger generating module 40 includes a trigger generating section 42. The trigger generating section 42 supplies a trigger signal 34 to the external instrument 300 connected to the device under test 200. The external instrument 300 acquires the signal output by the device under test 200 based on the supplied trigger signal 34. The trigger generating module 40 may be connected to the external instrument 300 via a cable such as a coaxial cable.

The test pattern generated by the pattern generating section 12 is input to the synchronization control section 16. The synchronization control section 16 supplies the trigger generating section 42 with a synchronization signal 30 instructing generation of the trigger signal 34, based on at least a portion of the input test pattern. For example, the synchronization signal 30 may include a pulse signal. The synchronization control section 16 may supply the trigger generating module 40 with the synchronization signal 30 via the synchronization network 70.

The synchronization control section 16 may supply the synchronization signal 30 to the synchronization network 70 via a synchronization pin that is provided separately from the I/O pin connected to the device under test 200. For example, the I/O pin may be connected to a driver and a comparator.

More specifically, the synchronization control section 16 outputs the synchronization signal 30 to the synchronization network 70. The synchronization network 70 outputs, to the trigger generating module 40, the trigger generation synchronization signal 32 generated based on the synchronization signal 30. The synchronization network 70 may also output, to the test module 10 and the trigger generating module 40, a reference clock 36 generated based on a reference signal generated by the reference signal generating section 60. The test module 10 and the trigger generating module 40 may operate in synchronization with the reference clock 36 output by the synchronization network 70.

The synchronization control section 16 may output, to the trigger generating section 42, the synchronization signal 30 that includes an event signal and timing data. The event signal may designate, in units of the cycle of the reference clock 36, a reference timing that serves as a reference for the generation of the trigger signal 34 by the trigger generating module 40. The timing data may indicate an amount by which the trigger signal 34 is delayed from the reference timing. The trigger generating section 42 may supply the external instrument 300 with the trigger signal 34 at a timing that is delayed by the amount designated by the timing data from the cycle of the reference clock 36 designated by the event signal.

Figure 2:
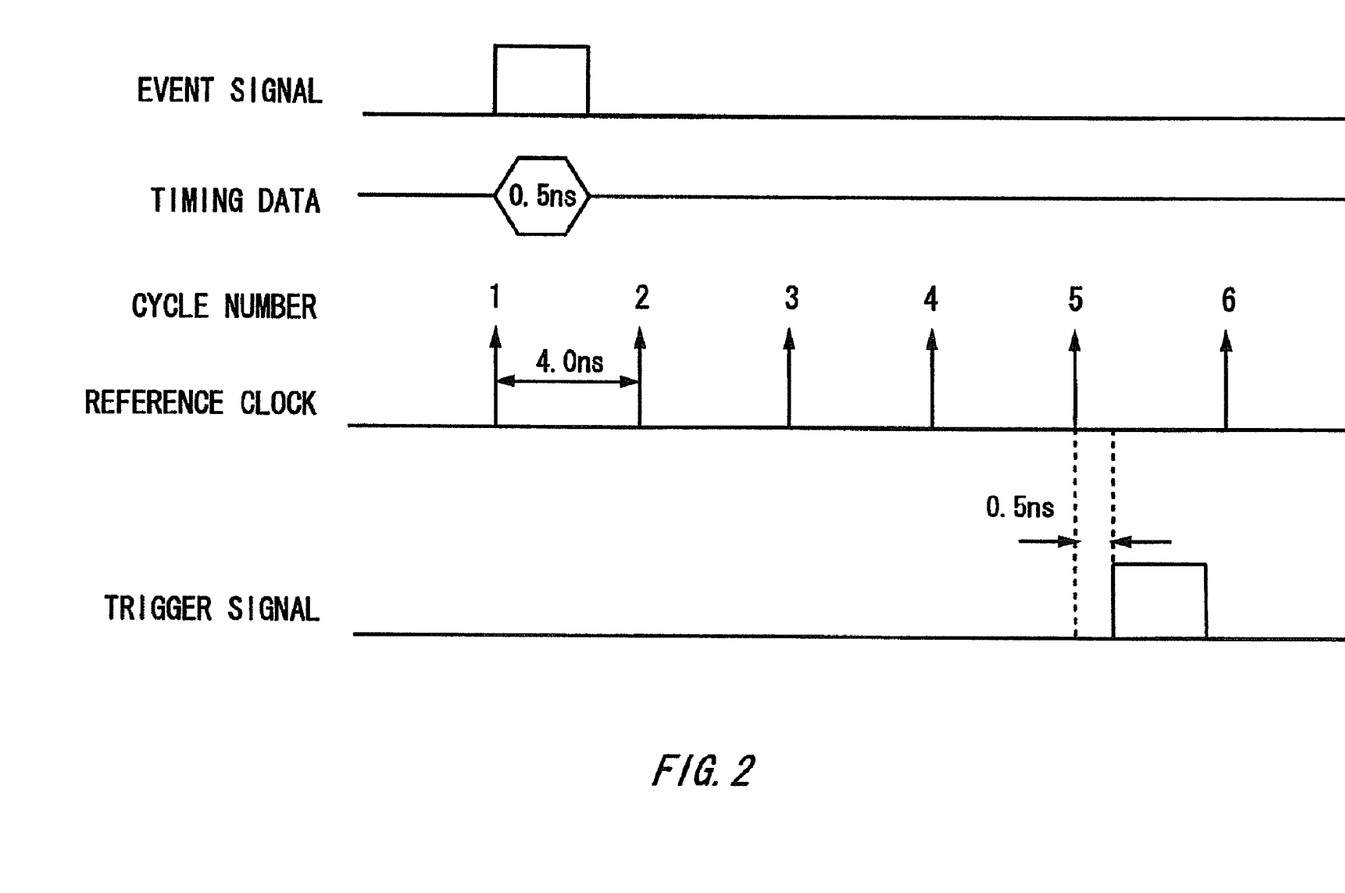
FIG. 2 shows the event signal and the timing data according to the first embodiment.

FIG. 2 shows an exemplary relationship between (i) the event signal and the timing data included in the synchronization signal 30 and (ii) the trigger signal 34 output by the trigger generating module 40. In the example of FIG. 2, the synchronization control section 16 generates the event signal and timing data that is in synchronization with the event signal and includes delay time information, based on information in the test pattern generated by the pattern generating section 12.

The synchronization control section 16 may output the event signal and the timing data to the synchronization network 70 in synchronization with the reference clock 36 output by the synchronization network 70. The synchronization network 70 generates the trigger generation synchronization signal 32 that includes the input event signal and timing data, and may output the generated trigger generation synchronization signal 32 to the trigger generating section 42.

In FIG. 2, when the event signal is H level, the synchronization control section 16 outputs timing data that includes information indicating a delay time of 0.5 ns. The synchronization network 70 delays the event signal and timing data output by the synchronization control section 16 by a time amount that corresponds to the prescribed number of cycles of the reference clock 36, and outputs the delayed trigger generation synchronization signal 32 to the trigger generating section 42. Upon receiving the trigger generation synchronization signal 32 including the event signal and the timing data, the trigger generating section 42 acquires delay time information written in the timing data.

The trigger generating section 42 may generate the trigger signal 34 at a timing that is delayed by 0.5 ns form the initiation timing of the reference clock at which the event signal is detected, based on the acquired delay time information. The trigger generating section 42 may output the generated trigger signal 34 to the external instrument 300. The external instrument 300 may acquire the signal output by the device under test 200 in synchronization with the input trigger signal 34.

Figure 3:
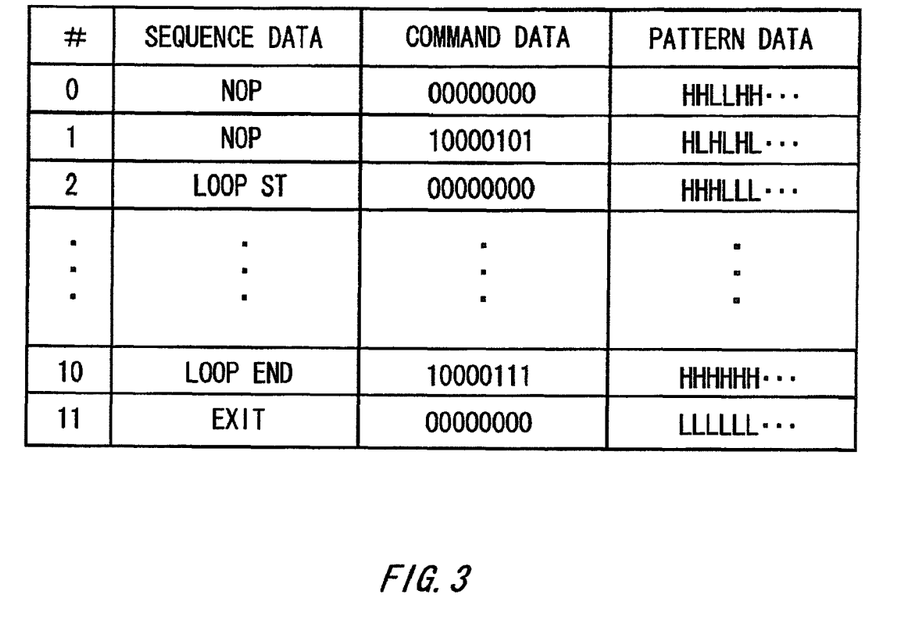
FIG. 3 shows an exemplary test pattern including the event signal and the timing data.

FIG. 3 shows an exemplary test pattern including the event signal and the timing data. In FIG. 3, "#" indicates the line number of the test pattern. The sequence data indicates the test program data for testing the device under test 200. The pattern generating section 12 sequentially generates test patterns corresponding to test criteria, based on the test program configured by the sequence data.

The command data includes information corresponding to the event signal and the timing data. The most significant bit of the command data may indicate whether an event signal is generated. For example, an event signal may be generated for a test pattern in which the most significant bit has a value of 0, and an event signal need not be generated for a test pattern in which the most significant bit has a value of 1. In FIG. 3, the test patterns at line numbers 1 and 10 are test patterns that generate event signals.

The lowest seven bits of the command data may indicate the delay time to be applied to the trigger signal 34. For example, the pattern generating section 12 may allocate, to the lowest seven bits of the command data, binary values that express the result of dividing the delay time to be applied to the trigger signal 34 by 0.1 ns.

The synchronization control section 16 may extract the command data included in the test pattern output by the pattern generating section 12. The synchronization control section 16 may generate the event signal based on a graph showing whether event signal generation is included in the command data. Furthermore, the synchronization control section 16 may generate timing data based on the information indicating the delay time included in the command data.

The test apparatus 100 with the above configuration can control the timing of the trigger signal output by the trigger generating module 40, based on the timing data and the event signal output by the test module 10. Accordingly, the test apparatus 100 can synchronize the test module 10 and the trigger generating module 40, even when the circuit of the test module 10 is changed but the circuit of the trigger generating module 40 is not changed, by determining in advance the delay time in the synchronization network 70 and the signal characteristic of the event signal and the timing data. Here, the signal characteristic may be an input/output time, a phase relationship, or a voltage level, of the event signal and the timing data.

A configuration is considered in which a test module houses the function of a trigger generating module, so that a single module can synchronize the testing of the semiconductor device and the measurement by the external instrument. In this case, however, the trigger signal is supplied to the external instrument using an I/O pin to be connected to the device under test. This creates a problem by decreasing the number of I/O pins of the test module that can be connected to the device under test. Furthermore, when replacing the test module, the wiring providing the connection to the external instrument must be changed. The test apparatus 100 of the present embodiment does not have these problems.

Figure 4:
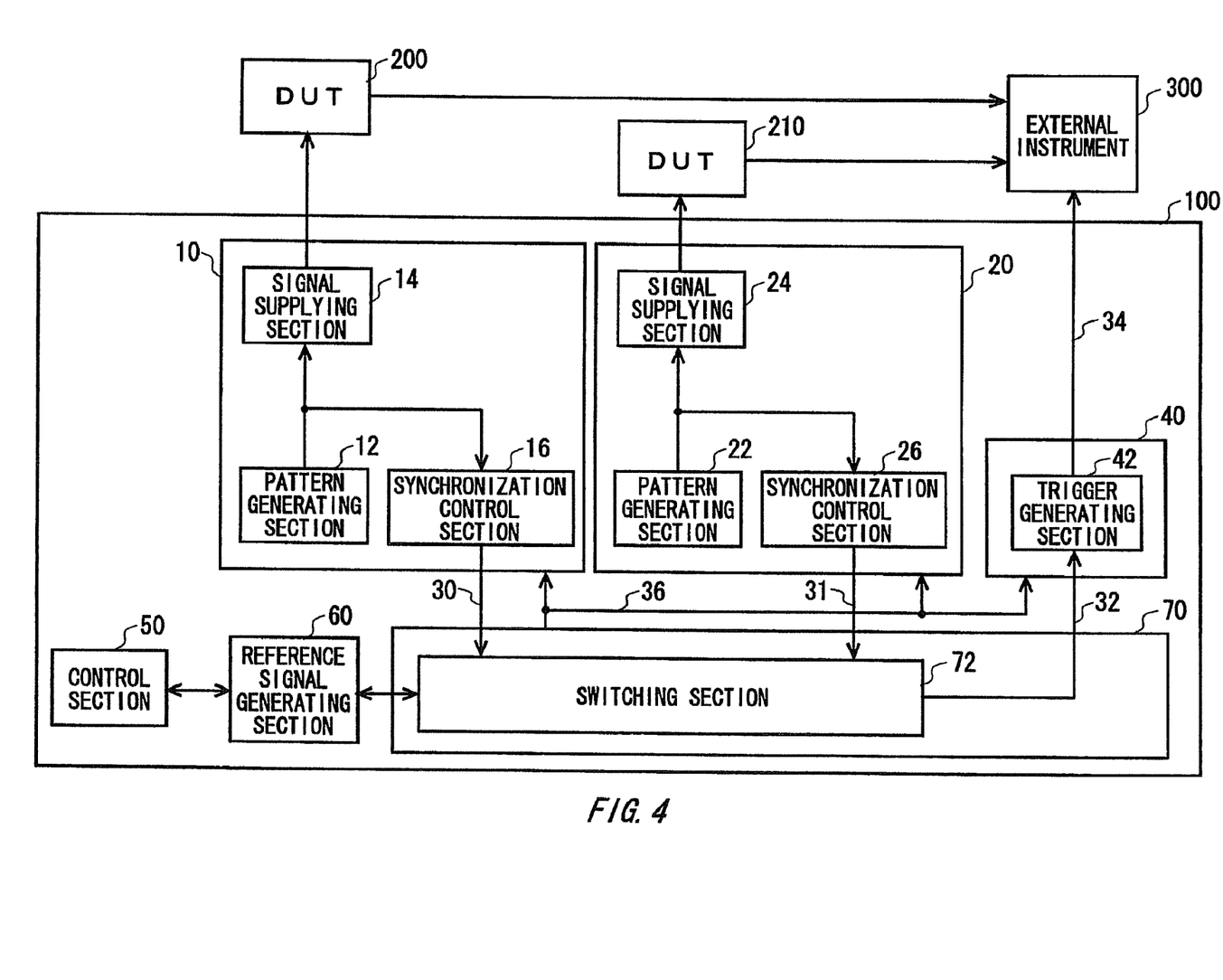
FIG. 4 shows an exemplary configuration of the test apparatus according to a second embodiment.

FIG. 4 shows an exemplary configuration of the test apparatus 100 according to a second embodiment. The test apparatus 100 of the present embodiment has a plurality of test modules. As shown in FIG. 4, the test apparatus 100 includes the test module 10, a test module 20, the trigger generating module 40, the control section 50, the reference signal generating section 60, and the synchronization network 70. The test module 10, the trigger generating module 40, the control section 50, and the reference signal generating section 60 have the same functions as the corresponding components in the test apparatus 100 shown in FIG. 1.

The test module 20 includes a pattern generating section 22, a signal supplying section 24, and a synchronization control section 26, and has the same function as the test module 10. The synchronization network 70 is connected to the test module 10, the test module 20, and the trigger generating module 40. The synchronization network 70 includes a switching section 72 that switches which of (i) the synchronization control section 16 in the test module 10 or (ii) the synchronization control section 26 in the test module 20 sends the synchronization signal to the trigger generating module 40, according to a setting.

The synchronization control section 16 outputs the synchronization signal 30 to the switching section 72. The synchronization control section 26 outputs a synchronization signal 31 to the switching section 72. The switching section 72 may select the input synchronization signal 30 or the input synchronization signal 31 under the control of the control section 50, and supply the selected signal to the trigger generating section 42.

The switching section 72 may monitor the signal level of the synchronization signal 30 and the synchronization signal 31 at each reference clock. The switching section 72 may select the synchronization signal whose event signal is H-level, for each cycle of the reference clock. The switching section 72 may supply the trigger generating section 42 with the trigger generation synchronization signal 32 generated based on the selected synchronization signal. The trigger generating section 42 generates the trigger signal 34 based on the input trigger generation synchronization signal 32, and supplies the trigger signal 34 to the external instrument 300. The switching section 72 may switch the selected synchronization signal for each type of test, or may switch the selected synchronization signal during testing.

The test module 10 or the test module 20 generates an event signal in a test pattern indicating that it is necessary for the external instrument 300 to measure the signal output by the device under test 200 or the device under test 210, respectively. The trigger generating section 42 generates the trigger signal 34 in synchronization with the event signal generated by the test module 10 or the test module 20. Accordingly, the test apparatus 100 of the present embodiment can acquire the signal waveform output by the device under test 200 or the device under test 210, based on the trigger signal 34 generated according to the timing of the signal output by whichever one of these devices under test has their signal measured by the external instrument 300.

Figure 5:
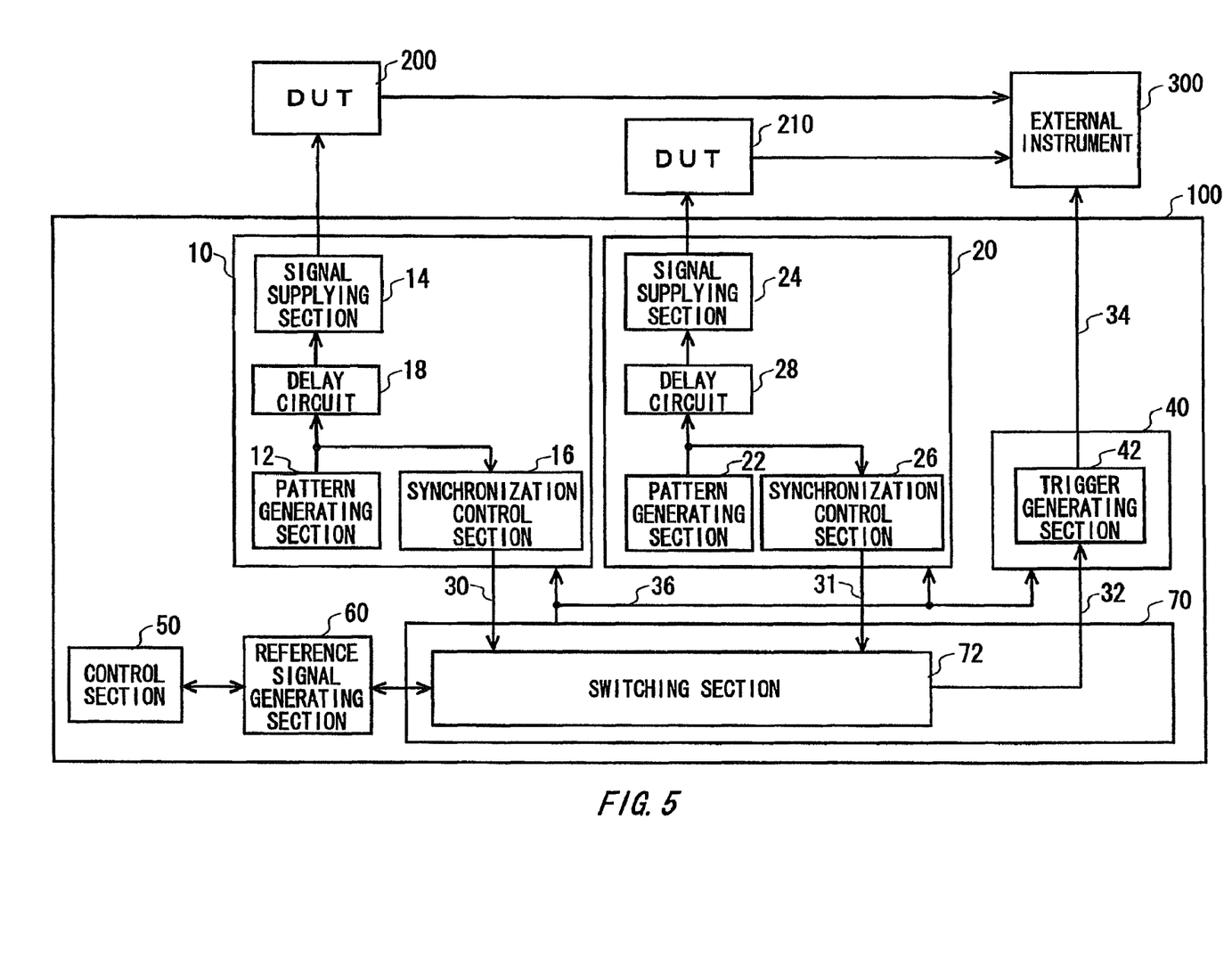
FIG. 5 shows an exemplary configuration of the test apparatus according to a third embodiment.

FIG. 5 shows an exemplary configuration of the test apparatus 100 according to a third embodiment. As shown in FIG. 5, the test module 10 includes a delay circuit 18 between the pattern generating section 12 and the signal supplying section 14. In the same way, the test module 20 includes a delay circuit 28 between the pattern generating section 22 and the signal supplying section 24. The signal supplying section 14 and the signal supplying section 24 may include the delay circuit 18 and the delay circuit 28, respectively.

A delay occurs in the synchronization network 70 from when the test module 10 or the test module 20 outputs the synchronization signal 30 to when the trigger generating section 42 outputs the trigger signal 34. The delay circuit 18 may compensate for the delay that exists from when the pattern generating section 12 generates the test pattern that generates the synchronization signal to when the trigger generating section 42 outputs the trigger signal 34. In the same way, the delay circuit 28 may compensate for the delay that exists from when the pattern generating section 22 generates the test pattern that generates the synchronization signal to when the trigger generating section 42 outputs the trigger signal 34.

For example, the time compensated for by the delay circuit 18 and the delay circuit 28 may be equal to the delay time occurring in the synchronization network 70. As another example, the time compensated for by the delay circuit 18 and the delay circuit 28 may be equal to a number of cycles of the reference clock 36 with a total length substantially equal to the delay time occurring in the synchronization network 70.

Figure 6:
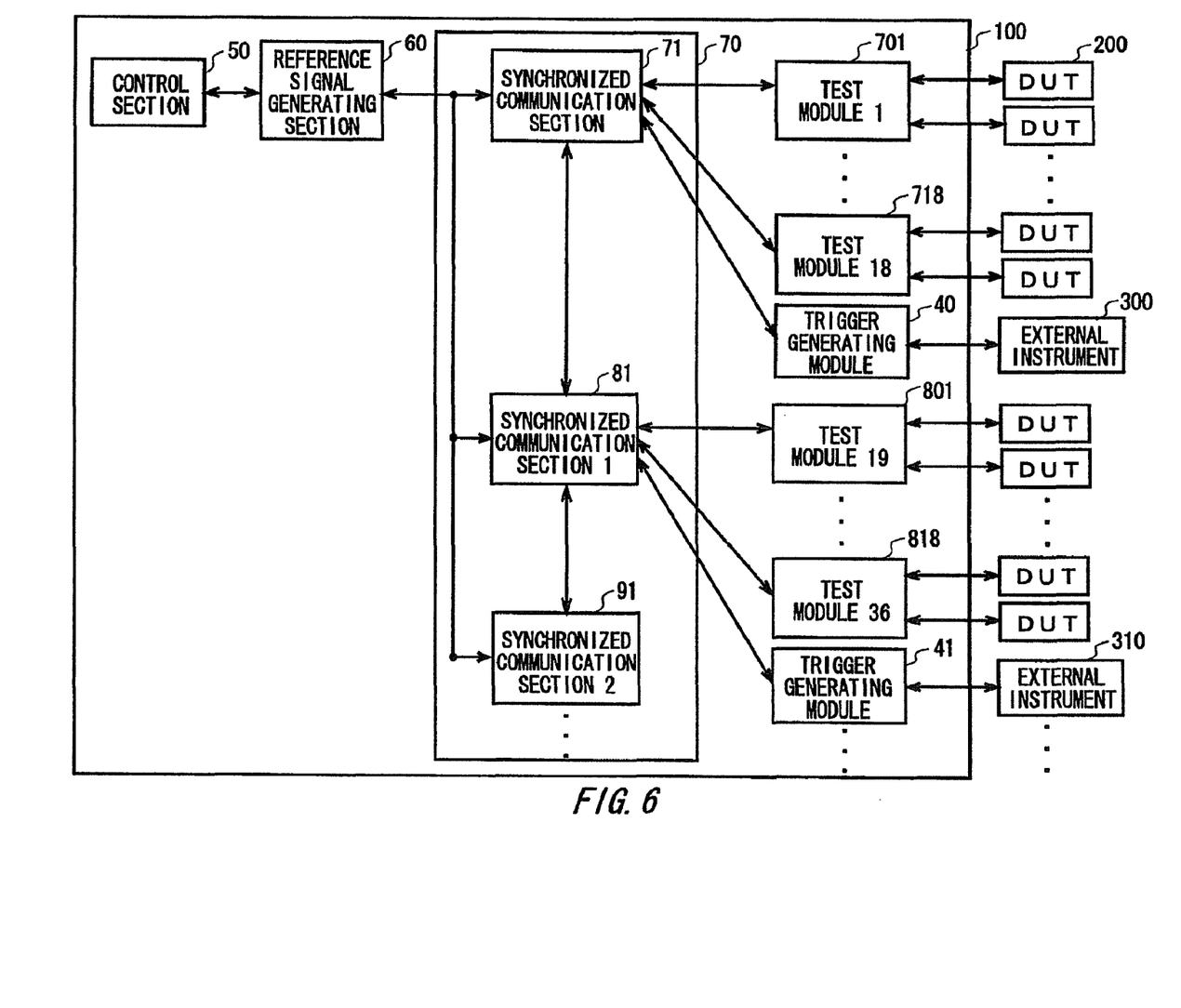
FIG. 6 shows an exemplary configuration of the test apparatus according to a fourth embodiment.

FIG. 6 shows an exemplary configuration of the test apparatus 100 according to a fourth embodiment. As shown in FIG. 6, the test apparatus 100 includes the control section 50, the reference signal generating section 60, and the synchronization network 70. The synchronization network 70 includes a synchronized communication section 71, a synchronized communication section 81, and a synchronized communication section 91. Each synchronized communication section is connected to a plurality of test modules. For example, the synchronized communication section 71 may be connected to test modules 701 to 718, and the synchronized communication section 81 may be connected to test modules 801 to 818.

The synchronized communication section 71 and the synchronized communication section 81 may be respectively connected to the trigger generating module 40 and a trigger generating module 41. Each test module may be connected to a plurality of devices under test 200.

The trigger generating module 40 outputs the trigger signal 34 to the external instrument 300. The trigger generating module 40 may output the trigger signal based on the event signal and the timing data output by the test modules connected to the synchronized communication section 71, i.e. the test modules 701 to 718. Accordingly, the external instrument 300 can acquire the signal in synchronization with the timing of the output of the signals by the devices under test 200 connected to the test modules 701 to 718. In the same way, the external instrument 310 can acquire the signals output by the devices under test 200 connected to the test modules 801 to 818.

Figure 7:
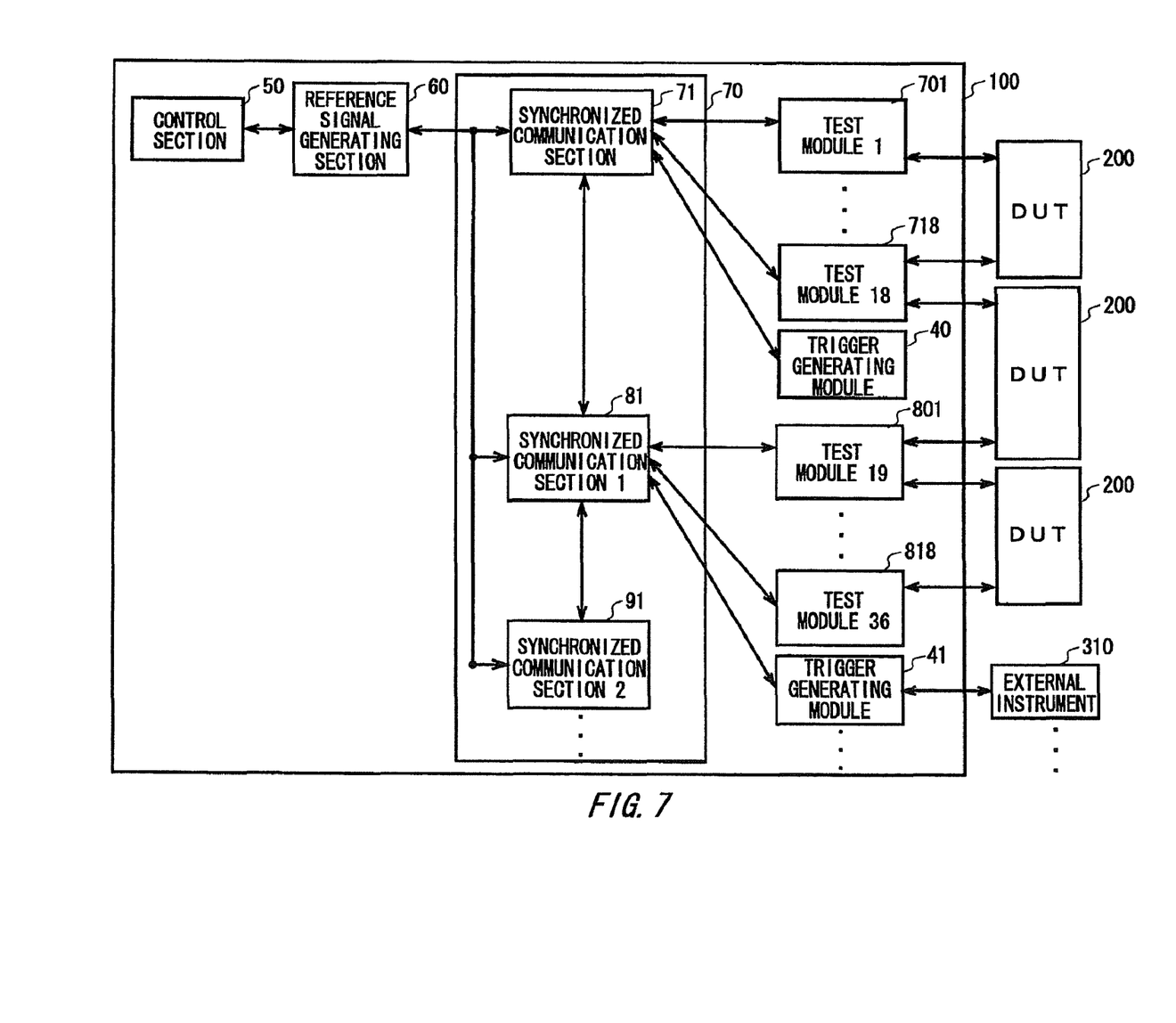
FIG. 7 shows a test apparatus with a configuration in which each device under test is connected to a plurality of different test modules.
Figure 8:
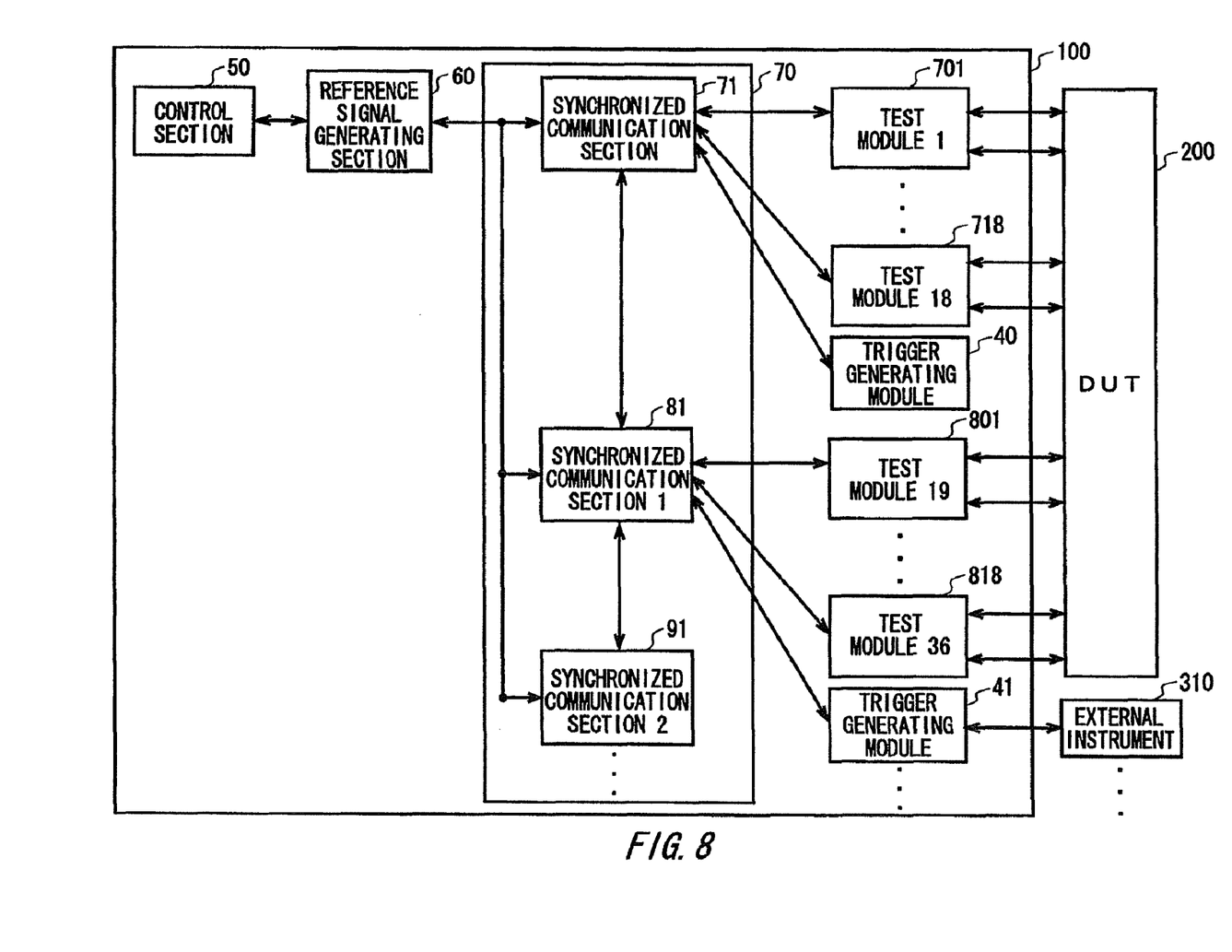
FIG. 8 shows a test apparatus with a configuration in which a single device under test is connected to a plurality of test modules.

The state of the connection between the test apparatus 100 and the devices under test is not limited to the state shown in FIG. 6. For example, FIG. 7 shows a test apparatus with a configuration in which each device under test 200 is connected to a plurality of different test modules. FIG. 8 shows a test apparatus with a configuration in which a single device under test 200 is connected to a plurality of test modules.

In FIGS. 7 and 8, the external instrument 310 is the only external instrument that measures the waveforms output by the devices under test 200. If the external instrument 310 is connected to all of the devices under test 200, the external instrument 310 can be shared to measure a plurality of devices under test 200.

When the external instrument 310 is connected to measure all of the test, modules 701 to 718 and the test modules 801 to 818, the trigger generating module 41 desirably outputs the trigger signal in synchronization with the synchronization signal output by a certain one or more of the test modules 701 to 718 and the test modules 801 to 818. Therefore, it is desired that the trigger generating module operate in synchronization with a plurality of different test modules connected to different synchronized communication sections.

Figure 9:
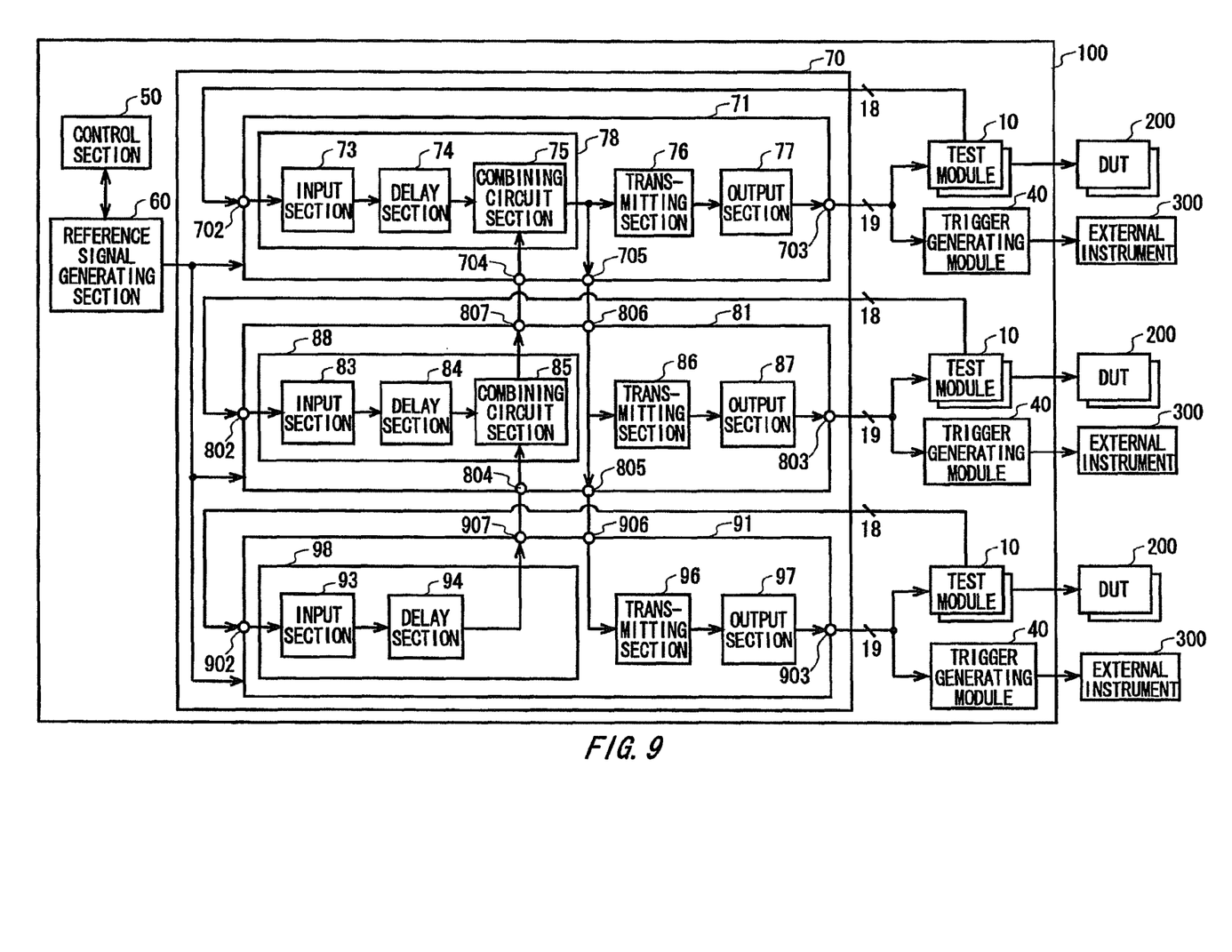
FIG. 9 shows an exemplary configuration of the test apparatus including a plurality of synchronized communication sections operating in synchronization.

FIG. 9 shows an exemplary configuration of the test apparatus 100 including a plurality of synchronized communication sections operating in synchronization. In FIG. 9, the test apparatus 100 includes the control section 50, the reference signal generating section 60, the synchronization network 70, a plurality of test modules 10, and a plurality of trigger generating modules 40. The synchronization network 70 is a plurality of connected synchronized communication sections, including the synchronized communication section 71, the synchronized communication section 81, and the synchronized communication section 91. The synchronized communication sections 71, 81, and 91 are controlled by the control section 50 to operate in synchronization with the reference clock output by the reference signal generating section 60.

The synchronized communication sections 71, 81, and 91 are each connected to a trigger generating module 40 and a plurality of test modules 10. Each trigger generating module 40 may be connected to an external instrument 300, and each test module 10 may be connected to a device under test 200.

The synchronized communication sections 71, 81, and 91 each receive a synchronization signal from a corresponding test module 10, and include a plurality of module-side input ports 702, a plurality of module-side input ports 802, and a plurality of module-side input ports 902. The synchronized communication sections 71, 81, and 91 each output the synchronization signal to at least one of the corresponding test modules 10 and trigger generating module 40, and include a plurality of module-side output ports 703, a plurality of module-side output ports 803, and a plurality of module-side output ports 903.

The synchronized communication sections 71, 81, and 91 include downstream input ports that receive a synchronization signal from a synchronized communication section connected downstream, downstream output ports that output a synchronization signal to a synchronized communication section connected downstream, upstream input ports that receive a synchronization signal from a synchronized communication section connected upstream, and upstream output ports that output a synchronization signal to a synchronized communication section connected upstream. For example, the synchronized communication section 71 and the synchronized communication section 81 are connected downstream from the synchronized communication section 81 and the synchronized communication section 91, respectively, and therefore the synchronized communication section 71 and the synchronized communication section 81 may include a downstream input port 704 and a downstream input port 804, respectively. The synchronized communication section 71 and the synchronized communication section 81 may also include a downstream output port 705 and a downstream output port 805, respectively.

The synchronized communication section 81 and the synchronized communication section 91 are connected upstream from the synchronized communication section 71 and the synchronized communication section 81, respectively, and therefore the synchronized communication section 81 and the synchronized communication section 91 may include an upstream input port 806 and an upstream input port 906, respectively. The synchronized communication section 81 and the synchronized communication section 91 may also include an upstream output port 807 and an upstream output port 907, respectively.

The number of ports in the plurality of module-side input ports in each of the synchronized communication sections 71, 81, and 91 may be equal to the number of test modules 10 connected to the synchronized communication section. The number of ports in the plurality of module-side output ports in each of the synchronized communication sections 71, 81, and 91 may be equal to a number obtained by adding together the number of test modules 10 and the number of trigger generating modules 40 connected to the synchronized communication section.

The synchronized communication section 71 includes a combining section 78, a transmitting section 76, and an output section 77. The synchronized communication section 81 includes a combining section 88, a transmitting section 86, and an output section 87. The synchronized communication section 91 includes a combining section 98, a transmitting section 96, and an output section 97. The plurality of synchronization signals input to the plurality of module-side input ports 702, 802, and 902 are received by the combining sections 78, 88, and 98.

The combining section 78 includes an input section 73, a delay section 74, and a combining circuit section 75. The combining section 88 includes an input section 83, a delay section 84, and a combining circuit section 85. The combining section 98 includes an input section 93 and a delay section 94.

The combining section in each synchronized communication section may combine the plurality of synchronization signals input from the plurality of module-side input ports. For example, the input sections 73, 83, and 93 may select the synchronization signals whose event signals are H-level, from among the synchronization signals input to the combining sections 78, 88, and 98 respectively, and output the selected synchronization signals to the delay sections 74, 84, and 94, respectively.

Each combining section may combine the plurality of synchronization signals input from the plurality of module-side input ports and downstream input ports. For example, the combining circuit section 75 may combine the synchronization signals output by the delay section 74 and the synchronization signals received from the downstream input port 704. The combining circuit section 85 may combine the synchronization signals output by the delay section 84 and the synchronization signals received from the downstream input port 804.

Each combining section may combine (i) the synchronization signals received from the downstream input port and (ii) the synchronization signals generated by the plurality of test modules at the same timing and delayed by the amount that is set such that these synchronization signals reach the combining section in the synchronized communication section furthest upstream at the same timing. For example, the delay sections 74, 84, and 94 may each delay the input synchronization signals by a prescribed amount. The delay sections 74 and 84 may output the delayed synchronization signals to the combining circuit sections 75 and 85 respectively. The delay sections 74, 84, and 94 may delay the input synchronization signals using a shift register.

The delay times set for the delay circuits in the upstream synchronized communication sections may be greater than the delay times set for the delay circuits in the downstream synchronized communication sections. For example, the delay time of the delay section 74 may be greater than the delay time of the delay section 84, and the delay time of the delay section 84 may be greater than the delay time of the delay section 94. Setting the delay times in this way enables compensation for the propagation time, which is the time necessary for a synchronization signal to be propagated from a downstream synchronized communication section to an upstream synchronized communication section. As a result, all of the synchronization signals output from the test modules 10 reach the combining circuit section 75 at the same timing.

The synchronized communication section 71, which is the communication section furthest upstream, includes the transmitting section 76 that transmits the synchronization signals combined by the combining circuit section 75 to the plurality of module-side output ports 703 and downstream output ports 705. The synchronized communication section 81 and the synchronized communication section 91, which are not the synchronized communication section furthest upstream, may each include a transmitting section that transmits the synchronization signals input from the upstream input ports to the plurality of module-side output ports and downstream output ports. For example, the transmitting section 86 may transmit the synchronization signals input from the upstream input port 806 to the plurality of module-side output ports 803 and downstream output ports 805. The transmitting section 96 may transmit the synchronization signals input from the upstream input port 906 to the plurality of module-side output ports 903.

The transmitting section in each synchronized communication section may delay the synchronization signals combined at the synchronized communication section furthest upstream by a delay time set such that the synchronization signals reach the plurality of test modules and trigger generating modules at the same timing, and transmits the delayed synchronization signals to the plurality of module-side output ports. For example, the transmitting sections 76, 86, and 96 may each include a shift register, and may delay the signals received from the combining circuit section 75 by the prescribed amount.

The delay times of the transmitting sections in the upstream synchronized communication sections may be greater than the delay times of the transmitting sections in the downstream synchronized communication sections. For example, the delay time of the transmitting section 76 may be greater than the delay time of the transmitting section 86, and the delay time of the transmitting section 86 may be greater than the delay time of the transmitting section 96. Setting the delay times in this way enables compensation for the propagation delay time between the synchronized communication sections so that the trigger signals can be output to all of the trigger generating modules at substantially the same timing.

The transmitting sections 76, 86, and 96 may output the delayed signals to the output sections 77, 87, and 97, respectively. The output sections 77, 87, and 97 may output the signals received respectively from the transmitting sections 76, 86, and 96 to the plurality of test modules 10 via the plurality of module-side output ports 703, the plurality of module-side output ports 803, and the plurality of module-side output ports 903, respectively.

With the above configuration, the synchronization network 70 can output the trigger signals to the trigger generating modules connected to the synchronized communication sections 71, 81 and 91, in synchronization with the synchronization signals output by the test modules 10 connected to any of the synchronized communication sections 71, 81, and 91. The synchronization network 70 can generate the trigger signals at substantially the same timing as the reference clock, regardless of the test modules 10 generating the event signals, by delaying the synchronization signals input into each synchronized communication section by the prescribed delay time in the delay sections 74, 84, and 94 and the transmitting sections 76, 86, and 96. As a result, all of the external instruments 300 connected to the test apparatus 100 can measure the signals of all of the devices under test 200 connected to the test apparatus 100.

As made clear from the above, the embodiments of the present invention can be used to realize a test apparatus for testing a device under test, which generates trigger signals to be supplied to external instruments in synchronization with test patterns for testing the device under test.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A test apparatus that tests a device under test, comprising:
   a pattern generating section that generates a test pattern for testing the device under test;
   a signal supplying section that supplies the device under test with a test signal corresponding to the test pattern;
   a trigger generating section that supplies a trigger signal to an external instrument connected to the device under test; and
   a synchronization control section that outputs, to the trigger generating section, a synchronization signal instructing generation of the trigger signal, based on at least a portion of the test pattern generated by the pattern generating section.

2. The test apparatus according to claim 1, further comprising a synchronization network that is connected between a test module, which includes the pattern generating section, the signal supplying section, and the synchronization control section, and a trigger generating module, which includes the trigger generating section, wherein the synchronization control section supplies the trigger generating module with the synchronization signal via the synchronization network.

3. The test apparatus according to claim 2, wherein the synchronization control section outputs the synchronization signal to the trigger generating section, the synchronization signal including (i) an event signal that designates, in units of a cycle of a reference clock of the test apparatus, a reference timing for generating the trigger signal and (ii) timing data indicating a delay amount, which is an amount by which the trigger signal is delayed in relation to the reference timing, and
   the trigger generating section supplies the external instrument with the trigger signal at a timing delayed from the cycle of the reference clock designated by the event signal by the delay amount indicated by the timing data.

4. The test apparatus according to claim 2, comprising a plurality of the test modules, wherein the synchronization network switches, according to a setting, which synchronization control section, from among the plurality of synchronization control sections of the test modules, transmits a synchronization signal to the trigger generating module.

5. The test apparatus according to claim 1, wherein the signal supplying section includes a delay circuit that delays generation of the test signal and compensates for a delay from (i) when the pattern generating section generates the test pattern for generating the synchronization signal to (ii) when the trigger generating section outputs the trigger signal.

6. A method for testing a device under test, comprising:
generating a test pattern for testing the device under test;
supplying the device under test with a test signal corresponding to the test pattern;
outputting a synchronization signal instructing generation of a trigger signal, based on at least a portion of the generated test pattern; and
supplying the trigger signal to an external instrument connected to the device under test, based on the synchronization signal instructing generation of the trigger signal.

* * * * *